(12) United States Patent
Van Schothorst et al.

(10) Patent No.: US 7,248,339 B2
(45) Date of Patent: Jul. 24, 2007

(54) LITHOGRAPHIC APPARATUS AND DEVICE MANUFACTURING METHOD

(75) Inventors: Gerard Van Schothorst, Hedel (NL); Jan Van Eijk, Eindhoven (NL); Erik Roelof Loopstra, Heeze (NL); Robert-Han Munnig Schmidt, Hapert (NL); Felix Godfried Peter Peeters, Lieshout (NL)

(73) Assignee: ASML Netherlands B.V., Veldhoven (NL)

( * ) Notice: Subject to any disclaimer, the term of this patent is extended or adjusted under 35 U.S.C. 154(b) by 79 days.

(21) Appl. No.: 10/880,606

(22) Filed: Jul. 1, 2004

(65) Prior Publication Data
US 2005/0041233 A1    Feb. 24, 2005

(30) Foreign Application Priority Data
Jul. 4, 2003    (EP)    .................................. 03254266

(51) Int. Cl.
*G03B 27/58*    (2006.01)
(52) U.S. Cl. ......................... 355/72; 355/75; 250/492.2
(58) Field of Classification Search ................. 355/72, 355/75
See application file for complete search history.

(56) References Cited

U.S. PATENT DOCUMENTS

| 5,229,872 A | 7/1993 | Mumola |
| 5,296,891 A | 3/1994 | Vogt et al. |
| 5,511,930 A * | 4/1996 | Sato et al. .................. 356/498 |
| 5,523,193 A | 6/1996 | Nelson |
| 5,812,420 A | 9/1998 | Takahashi |
| 5,815,246 A | 9/1998 | Sperling et al. |
| 5,969,441 A | 10/1999 | Loopstra et al. |
| 6,046,792 A | 4/2000 | Van Der Werf et al. |
| 2003/0030779 A1* | 2/2003 | Hara ........................... 355/53 |
| 2004/0252287 A1* | 12/2004 | Binnard et al. ................ 355/53 |

FOREIGN PATENT DOCUMENTS

| EP | 0 502 578 | 9/1992 |
| EP | 0 866 374 | 9/1998 |
| EP | 1 111 469 | 6/2001 |
| JP | 2000-216082 | 8/2000 |
| WO | WO 98/33096 | 7/1998 |
| WO | WO 98/38597 | 9/1998 |

* cited by examiner

*Primary Examiner*—D Rutledge
(74) *Attorney, Agent, or Firm*—Pillsbury Winthrop Shaw Pittman LLP

(57) ABSTRACT

A lithographic apparatus is presented in which vibrations induced by reaction forces exerted on a base frame BF by accelerations within the apparatus are eliminated without the need for complex positioning systems and several balance masses. This is achieved by using feed-forward control to apply a compensating force using actuators to the base frame, based on knowledge of the movements and accelerations of the substrate table and other parts within the apparatus.

11 Claims, 3 Drawing Sheets

LITHOGRAPHIC APPARATUS AND DEVICE MANUFACTURING METHOD

BACKGROUND OF THE INVENTION

1. Priority Information

This application claims priority from European Patent Application No. 03254266.4, filed Jul. 4, 2003, the contents herein incorporated by reference in its entirety.

2. Field of the Invention

The present invention relates to a lithographic apparatus and a device manufacturing method.

3. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

The term "patterning device" as here employed should be broadly interpreted as referring to a device that can be used to impart an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

a mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, the support structure will generally be a mask table/holder/holder, which ensures that the mask can be held at a desired position in the incoming radiation beam, and that it can be moved relative to the beam if so desired;

a programmable mirror array: one example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as non-diffracted light. Using an appropriate filter, the non-diffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation mechanism. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described here above, the patterning device can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the support structure may be embodied as a frame or table, for example, which may be fixed or movable as required; and a programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table/holder/holder; however, the general principles discussed in such instances should be seen in the broader context of the patterning device as set forth here above.

In general, a single wafer will contain a whole network of adjacent target portions that are successively irradiated via the projection system, one at a time. In current apparatus, employing patterning by a mask on a mask table/holder/holder, a distinction can be made between two different types of machine. In one type of lithographic projection apparatus, each target portion is irradiated by exposing the entire mask pattern onto the target portion in one go; such an apparatus is commonly referred to as a wafer stepper.

In an alternative apparatus-commonly referred to as a step-and-scan apparatus—each target portion is irradiated by progressively scanning the mask pattern under the projection beam in a given reference direction (the "scanning" direction) while synchronously scanning the substrate table/holder/holder parallel or anti-parallel to this direction. Since, in general, the projection system will have a magnification factor M (generally <1), the speed V at which the substrate table/holder is scanned will be a factor M times that at which the mask table/holder is scanned. More information with regard to lithographic devices as here described can be gleaned, for example, from U.S. Pat. No. 6,046,792, incorporated herein by reference.

During the manufacturing process, if the substrate table/holder(s) and/or mask table/holder(s) are moved by an actuator attached to the base frame, a reaction force will be exerted on the base frame. The forces involved can be large because the mass of the table is between 10 and 150 Kg, typically 40–70 kg and the accelerations of the order of 5–100 m/s². Ideally the base frame is internally very stiff and would be stiffly connected to the floor, but in reality such connections have some compliance. Therefore, the forces can induce vibrations in the base frame which adversely affect the accuracy of the lithographic process, because they disturb the position sensors of the substrate and/or mask table.

To overcome this problem, a system of balance masses, such as that illustrated in FIG. 2, has been proposed. The base frame BF is stiffly connected to the floor 2 via connecting members 4. A substrate table/holder comprising a first element 6 and a second element 7 is supported on the base frame BF. A short stroke actuator 8 connects the first element 6 and the second element 7. The base frame BF also supports a balance mass 12 connected to the second element 7 of the substrate table by long stroke actuator 10.

To move the substrate that is situated on the second element 7, the short stroke actuator 8 is activated and generates a force to move the element 7. Simultaneously, the first element 6 is moved by the long stroke actuator 10 in such a way the short stroke actuator 8 remains operational because the relative position of first element 6 to second element 7 is kept constant. So the first element 6 keeps tracking the position of the second element 7. This is a so-called "slave position control loop". Applying this principle, the short stroke actuator 8 can be designed to be very accurate over a small working range (short stroke). The long stroke actuator 10 can be designed to be less accurate but it can operate on a large stroke (long stroke). The reaction force from actuator 10 is applied to the balance mass 12 that is left free to move in the actuated direction. By this, the reaction force cannot disturb the base frame.

Therefore, the net force exerted on the base frame is zero. The distance the substrate table WT and the balance mass 12 move relative to each other is determined by the ratio of their masses, according the law of conservation of momentum. Such a system is discussed in U.S. Pat. No. 5,815,246. U.S. Pat. No. 5,969,441 discusses a similar system where a common balance mass is used for two object holders.

Various alternative systems of balance masses are known. For example in one such alternative system the balance mass described above may take the form of a sub-frame that supports the substrate table (that may consist of 1 or 2 elements). An actuator connects the sub-frame to the substrate table. The sub-frame is free to move relative to the base frame. When the actuator is operated, the sub-frame moves under the reaction force, as described above, but no vibrations are transferred to the base frame. A damping system can connect the sub-frame (balance mass) to the base frame to reduce the range of movement of the sub-frame.

In all the above systems, the balance mass is connected to the substrate table by an actuator. While these solutions reduce the forces transmitted to the base frame and the consequential vibrations of the base frame, the complexity of the systems introduces further problems. These systems are also difficult to adapt for use when the substrate table is moved with six degrees of freedom all of which generate large acceleration forces because the balance mass must then also be capable of six degrees of freedom.

SUMMARY OF THE INVENTION

The principles of the present invention, as embodied and broadly described herein, provide a lithographic apparatus which is configured to reduce the vibration of a base frame, without requiring the complexity of construction and operation of previously known systems. In one embodiment, the lithographic apparatus comprises a substrate holder configured to hold a substrate; a radiation system configured to condition a beam of radiation; a support structure configured to support a patterning device that imparts a desired pattern onto the beam of radiation; a projection system that projects the patterned beam onto a target portion of the substrate; a base frame; at least one actuator that moves the substrate holder relative to the base frame; and a balance mass arranged such that the substrate holder exerts a reaction force on the balance mass. The balance mass is resiliently connected to the base frame with a suspension frequency that is different than resonant frequency of the base frame.

The suspension frequency does not equal the resonant frequency of the base frame or indeed any of the frequencies around resonant frequencies of the base frame. The suspension frequency is chosen to not equal to the resonant frequency of the base frame so that it filters the content of the forces exerted on the base frame, forming a dynamic filter. The suspension frequency is preferably low and the frequency content beyond the suspension frequency is reduced considerably, thus reducing the content of the resonant frequency of the base frame. The balance mass is not controlled actively, eliminating the need for a controller to control its movement.

Preferably, the balance mass comprises a sub-frame supported by the base frame and on which the substrate table is placed. This is a simple way of implementing the invention.

Preferably, the apparatus may further comprise a resilient mechanism and/or a damper connected between the base frame and the balance mass to damp unwanted movements of the balance mass.

According to another embodiment of the present invention, there is provided a lithographic apparatus that comprises a substrate holder configured to hold a substrate; a radiation system configured to condition a beam of radiation; a support structure configured to support a patterning device that imparts a desired pattern onto the beam of radiation; a projection system that projects the patterned beam onto a target portion of the substrate; a base frame; at least one actuator configured to apply a force to the base frame; and a controller configured to control the at least one actuator. When a reaction force is applied to the base frame, the controller controls the actuator to apply a force, which is opposite in magnitude and direction to the reaction force, to the base frame.

A force to cancel the reaction force is therefore applied directly to the base frame. If the base frame is internally rigid, there will be a force cancellation and the base frame will remain undisturbed. There is no need to provide a balance mass allowing the apparatus to be cheaper to construct and maintain, whilst preserving the benefit of canceling vibrations in the base frame. The size and weight of the apparatus can be reduced, because there is no need to provide a balance mass. There is also no need for complex cable routing solutions to ensure that the movements of the balance mass do not snag the cables. The positioning control system for the substrate and mask tables is simplified because there is no balance mass connected to them and therefore the effect of the balance mass on movements of the substrate or mask table no longer has to be considered.

In one embodiment of the present invention, said at least one actuator is connected between the base frame and a floor on which the base frame rests and the controller controls said at least one actuator using feedforward control with an input of known movements within the lithographic apparatus which exert a reaction force on the base frame.

This removes any requirement for additional components in the imaging section of the apparatus. The reaction forces exerted on the base frame are compensated by the force exerted by the actuators. The net forces and moments on the base frame are reduced to zero and no vibrations are induced. Control of the at least one actuator uses variables already known from the control of the movements of the substrate and mask tables, and therefore the increase in controller complexity is minimal.

Preferably the at least one actuator is a piezo-electric actuator. Using piezo-electric actuators ensures that the connection between the base frame and the floor is stiff when the actuators are not applying a force.

According to another embodiment of the present invention said support structure comprises a mask table for holding a mask and a mask frame for supporting the mask table for relative movement thereto, the mask frame being connected to the base frame by said actuator and supported for movement relative to the base frame, and in that the controller controls said actuator using feedforward control based on the known movements of the patterning means relative to the support structure.

The movements of the mask table will exert a reaction force on the mask frame which will in turn exert a force on the base frame. In this situation the actuators can be controlled to reduce the net force exerted on the base frame to zero. The compensation works with six degrees of freedom, and has no requirement for a balance mass.

Feedback control may be incorporated to monitor the relative movements of the mask frame to the base frame. This provides a check that the feedforward control is working properly. (When it is working properly the relative movement will be very small, if not zero.)

In another embodiment of the present invention, the apparatus further comprises a balance mass connected to said base frame by said at least one actuator, wherein said controller controls said at least one actuator using feedforward control with an input of known movements within the apparatus which exert a reaction force on the base frame.

The balance mass is connected directly to the base frame and not connected to the substrate table. This allows a single balance mass to compensate for movements of all items within the apparatus which apply a reaction force to the base frame.

Optionally, said controller has an input of known movements within the apparatus which exert a reaction force on the base frame only in the main scanning direction of the base frame.

Therefore the construction and control of the balance mass system is simplified because it is only compensating for reaction forces in a single direction.

Alternatively, the support structure comprises a mask table for holding a mask, and wherein said known movements within the apparatus are movements of said substrate table and/or said mask table.

The apparatus can therefore compensate for the vibrations induced in the base frame by reaction forces arising from movements of the substrate and/or mask tables.

According to a further embodiment of the invention there is provided a device manufacturing method comprising providing a substrate that is at least partially covered by a layer of radiation-sensitive material; conditioning a beam of radiation; applying a patterning device to configure the conditioned beam of radiation with a desired pattern in its cross-section; projecting the patterned beam of radiation onto a target portion of the first substrate during the projection phase; applying a force that is opposite in direction and magnitude to the base frame when acceleration of an article exerts a reaction force on a base frame.

According to this method, the effect of reactions forces can be compensated with no need for a balance mass. The net force exerted on the base frame is zero, eliminating vibrations induced. The method can also easily be used to compensate with six degrees of freedom.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5–20 nm), as well as particle beams, such as ion beams or electron beams.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The term "lens", where the context allows, may refer to any one or combination of various types of optical components, including refractive, reflective, magnetic, electromagnetic and electrostatic optical components.

BRIEF DESCRIPTION OF DRAWINGS

Embodiments of the invention will now be described, by way of example only, with reference to the accompanying schematic drawings in which corresponding reference symbols indicate corresponding parts, and in which.

In the Figures, corresponding reference symbols indicate corresponding parts.

DETAILED DESCRIPTION OF THE INVENTION

Lithographic Apparatus

Figure 1:
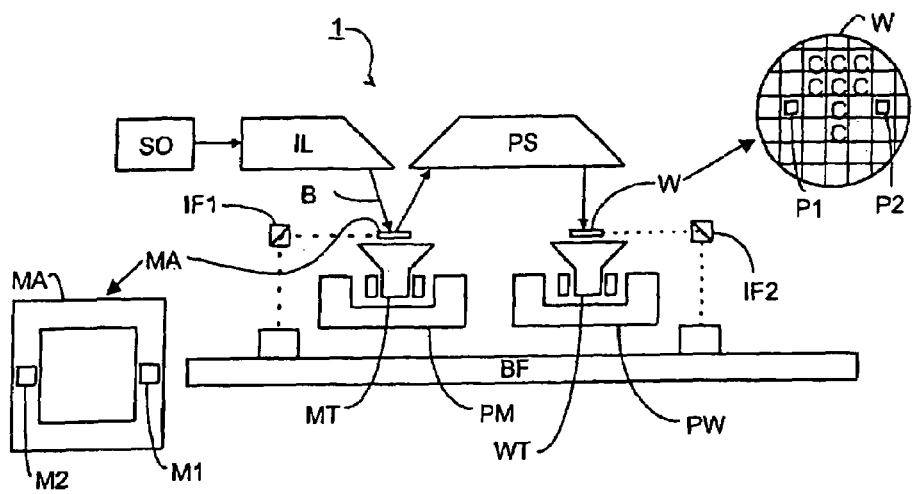
FIG. 1 depicts a lithographic projection apparatus according to a first embodiment of the invention.
Figure 2:
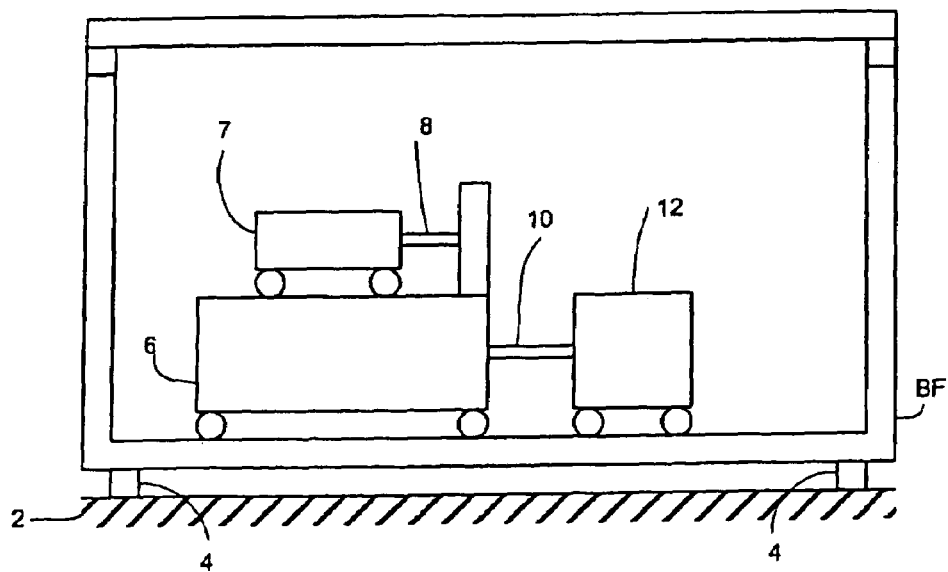
FIG. 2 depicts a system of active balance masses known in the prior art.

FIG. 1 schematically depicts a lithographic projection apparatus 1 according to a particular embodiment of the invention. The apparatus comprises:
- an illumination system (illuminator) Ex, IL: for supplying a projection beam PB of radiation (e.g. EUV, DUV, or UV radiation). In this particular case, the radiation system also comprises a radiation source SO;
- a first object table (mask table/holder/holder) MT: provided with a mask holder for holding a mask MA (e.g. a reticle), and connected to first positioning mechanism for accurately positioning the mask with respect to item PL;
- a second object table (substrate table/holder) WT: provided with a substrate holder for holding a substrate W (e.g. a resist-coated silicon wafer), and connected to second positioning mechanism for accurately positioning the substrate with respect to item PL;
- a projection system ("lens") PL: for example, a mirror or refractive lens system that images an irradiated portion of the mask MA onto a target portion C (comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure maybe a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate.

An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus maybe separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as s-outer and s-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B.

Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM.

Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus can be used in different modes:
step mode: the mask table MT is kept essentially stationary, and an entire mask image is projected in one go (i.e. a single "flash") onto a target portion C. The substrate table WT is then shifted in the X and/or Y directions so that a different target portion C can be irradiated by the beam PB;

scan mode; essentially the same scenario applies, except that a given target portion C is not exposed in a single "flash". Instead, the mask table MT is movable in a given direction (the so-called "scan direction", e.g. the Y-direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution; and other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIRST EMBODIMENT

Figure 3:
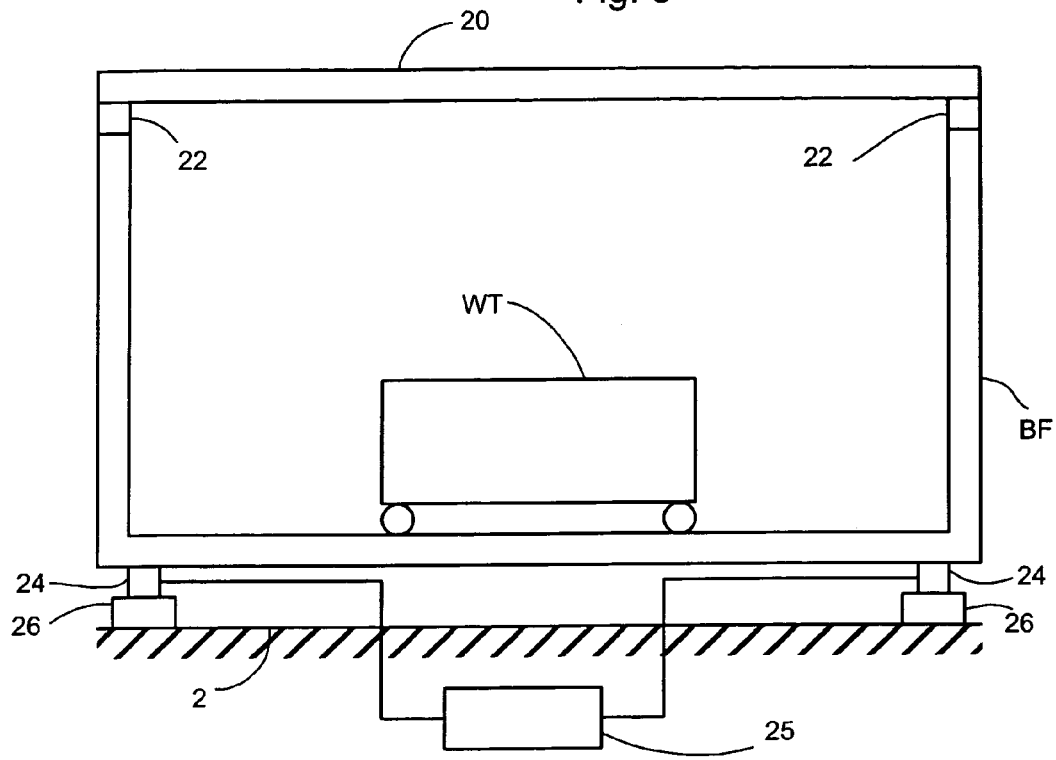
FIG. 3 depicts a vibration reduction system according to a first embodiment of the present invention.

FIG. 3 depicts a base frame BF which supports a reference frame 20 supported by with a vibration isolation suspension system 22. In this embodiment, the vibration isolation system is formed by air-mounts, but other constructions are possible, for example using a gas bearing. The vibration isolation system 22 acts to reduce the transmission of vibrations of the base frame BF to the reference frame 20. It is important to reduce these vibrations because the reference frame 20 carries instruments, such as interferometers, which are needed for the accurate operation of the apparatus. Any vibrations that pass on may adversely affect their accuracy. The vibration isolation system 22 ensures that any vibrations passed from the floor 2 to the base frame BF are not passed on to the reference frame.

The substrate table WT is supported on the base frame BF and capable of moving with six degrees of freedom relative to the base frame BF. The support structure is designed to allow this movement to occur as near as possible without friction. In this embodiment the substrate table WT is mounted on a planar motor, the planar motor can move the substrate table WT relative to the base frame BF. Other types of actuator can also be used, for example a direct connection between the substrate table WT and the base frame BF.

The base frame BF is stiffly connected via supports 24 and piezo-electric actuators 26 to the floor 2. When the actuators 26 are not applying any force to the base frame the connection is rigid. Other types of actuator which are rigid when not applying a force are such as camdiscs or spindles with a large transmission ratio are also suitable. Piezo-electric transducers have a limited displacement range, of the order of 1 pm to 1 mm. If a larger displacement range is required a transmission formed by an elastic mechanical lever or another type of mechanical amplifier can be included between the actuator 26 and the support 24.

The accelerations of the substrate table WT during its movement will cause a reaction force to be exerted on the base frame BF and will induce vibrations of the base frame BF if not compensated. Although the vibration isolation system 22 acts to reduce the vibrations transmitted from the floor to the reference frame 20, they are not effective enough to allow the accuracy of the device to be maintained when vibrations are also induced in the base frame BF by the large accelerations of the substrate table WT.

The actuators 26 are controlled to exert a force opposite in magnitude and direction to the reaction force experienced by the base frame. The controller 25 basically uses feedforward control; the accelerations of the substrate table WT are known and can therefore be used to calculate the reaction force exerted on the base frame. By controlling the actuators 26 in this way the net force exerted on the base frame is zero and no movement or vibration of the base frame occurs. Vibrations induced in the base frame by accelerations of the substrate table WT are therefore eliminated, and the apparatus can compensate reaction forces with six degrees of freedom.

The construction of the present embodiment is simpler than the prior art systems using balance masses. No balance masses are required. The control of the actuators 26 uses the same command position and force information used in the normal operation of the apparatus (for example from the substrate table WT or from the mask table MT). It can therefore be implemented simply and cheaply.

Although the operation has been described with reference to the movements of a single wafer table WT, the control of the actuators can also be modified to compensate for the movements of more than one wafer table in a multi-stage apparatus. All that is required is to modify the control system 25 to receive input data on the movements of the other tables.

Furthermore, the construction of this embodiment can be adapted to be fitted retrospectively to existing apparatus. This can be as simple as installing actuators 26 and a related control system 25.

Although this embodiment has described compensating for all reaction forces exerted on the base frame BF in six degrees of freedom, it could also compensate in only one, two, three, four or five degrees of freedom. For example, it could compensate only for reaction forces in the main scanning direction of the apparatus.

SECOND EMBODIMENT

Figure 4:
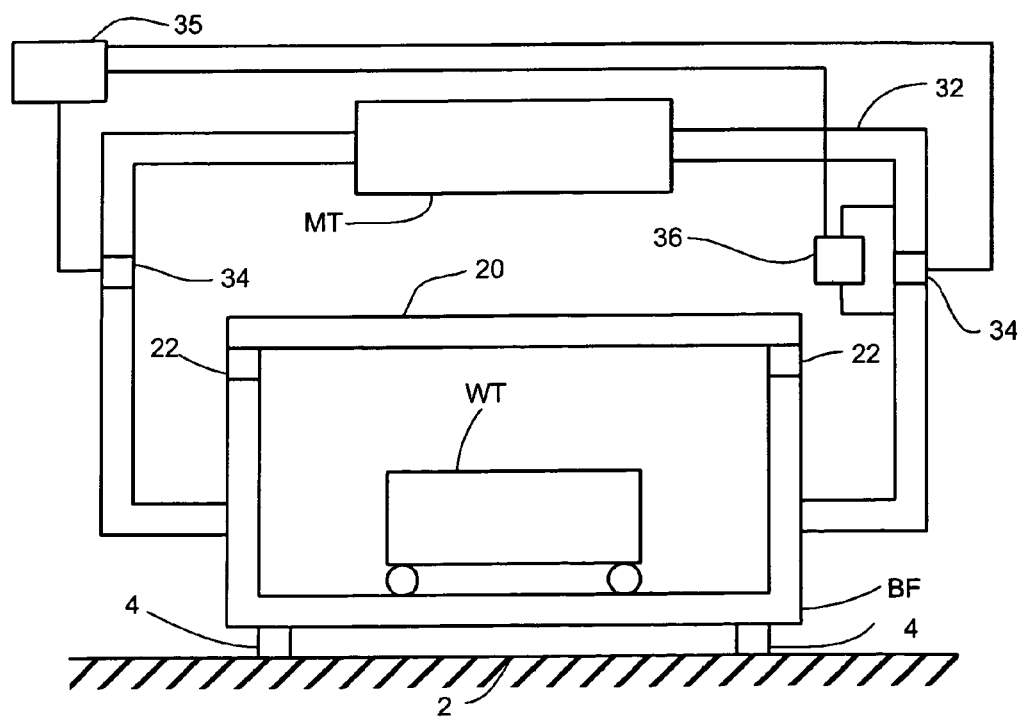
FIG. 4 depicts a vibration reduction system according to a second embodiment of the present invention.

The construction of a second embodiment of the invention is illustrated in FIG. 4. The construction of this embodiment is as for the first embodiment, save as described below.

In this embodiment a mask table MT is supported by a mask frame 32. The mask table MT can move relative to the mask frame 32 without any significant friction. A planar motor moves the mask table MT with six degrees of freedom. Active vibration isolators 34 connect the mask frame 32 to the base frame BF and also act as suspension of the mask frame, reducing the transmission of vibrations from the floor to the mask frame via the base frame BF.

When the mask table MT is moved relative to the mask frame 32 a reaction force is exerted on the mask frame 32. The action of this reaction force causes the mask frame to move relative to the base frame BF, due to the compliant nature of the vibration isolators 34. However, a controller 35 controls the vibration isolators to apply a force to the mask frame opposite in magnitude and direction to the reaction force which counteracts the movement.

Movements of the mask table MT are known and are provided as an input to the controller 35. It can therefore calculate the movement of the mask frame 32 under the reaction force. The vibration isolators 34 are then controlled on a feedforward basis to ensure that the motion of the mask frame does not induce any unwanted forces on base frame BF. This means that no vibrations are induced in the base frame BF by the movement of the mask frame 32.

To monitor that the system is working correctly, a sensor 36 measures the relative position of the mask frame 32 and the base frame BF. The output of this sensor is supplied to the controller 35 for use in a feedback control loop, improving the accuracy of the control system.

Thus, the present embodiment eliminates the need for a balance mass to reduce vibrations induced in the base frame BF by the movement of the mask table MT.

Any system used to minimize vibrations induced in the base frame by the movement of the substrate table WT can be combined with this embodiment. For example, this embodiment can also include the active connection between the floor and the base frame, as described above.

THIRD EMBODIMENT

Figure 5:
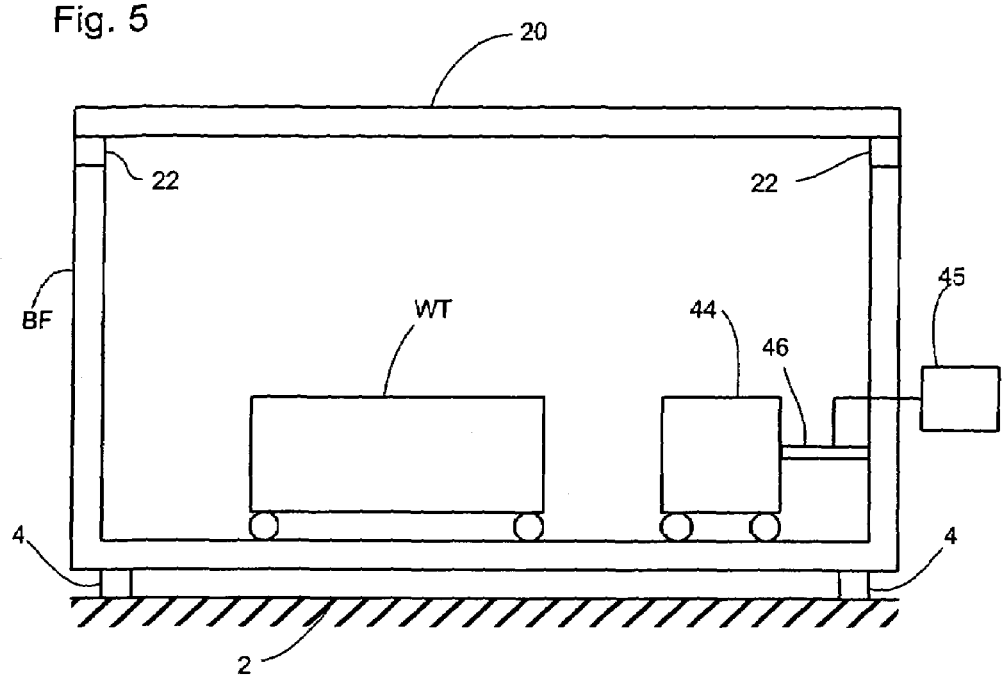
FIG. 5 depicts a vibration reduction system according to a third embodiment of the present invention.

A third embodiment of the present invention is shown in FIG. 5. The construction of this embodiment is as for the first embodiment save as described below.

A single balance mass 44 is connected to a base frame BF by an actuator 46. A controller 45 controls the actuator 46 using feed-forward control. The movements and accelerations of the substrate table WT and the mask table are known and are used by the controller to calculate the reaction forces exerted on the base frame BF. The actuator 46 is therefore controlled so that accelerations (and resultant reaction forces) of the balance mass cancel the reaction forces applied to the base frame by the substrate and/or mask tables. The net force on the base frame is zero.

More than one actuator 46 may be provided to move the balance mass with more than one degree of freedom. Alternatively, the actuator can be a planar motor between the balance mass 44 and the base frame BF. A planar motor can move the balance mass with up to six degrees of freedom.

The single balance mass 44 and actuator 46 can be controlled to correct for all reaction forces exerted on the base frame by the substrate and mask tables. Alternatively, the controller 45 can be simplified by only compensating for the reaction forces in the main scanning direction, for example the Y direction.

It will be appreciated that this embodiment can be combined with the systems of the above first or second embodiments.

FOURTH EMBODIMENT

Figure 6:
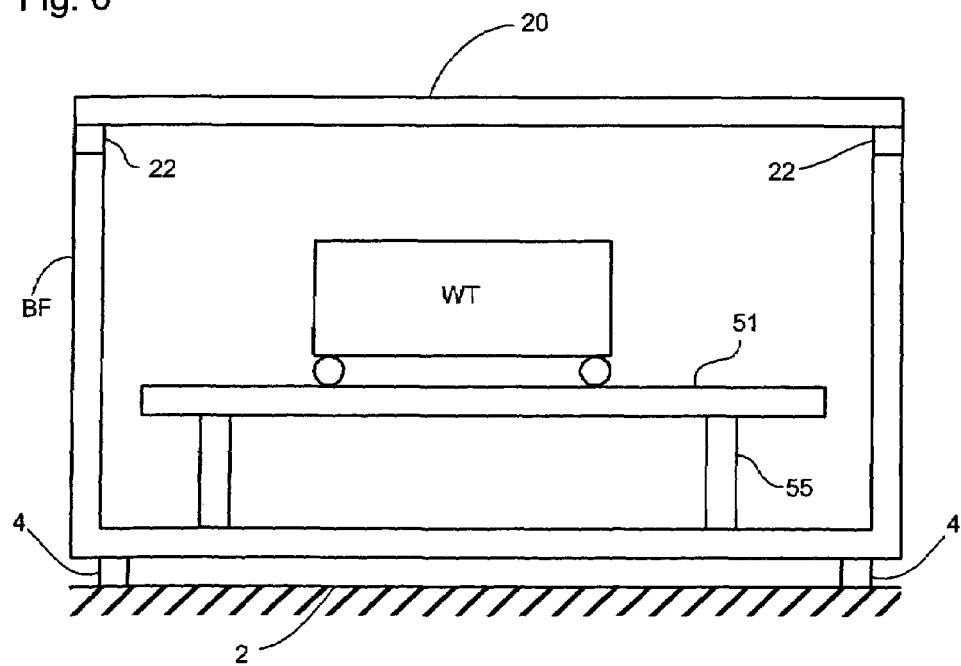
FIG. 6 depicts a vibration reduction system according to a fourth embodiment of the present invention.

A fourth embodiment of the present invention is illustrated in FIG. 6. The construction of this embodiment is as for the first embodiment, save as described below.

A sub-frame 51 is supported on the base frame BF by supporting means 55. Substrate table WT is arranged on sub-frame 51 and is moved relative to said base frame BF by a planar motor. Other types of actuator could also be used to move the substrate table WT. Reaction forces from the motion of substrate table WT are exerted on sub-frame 51 and sub-frame 51 forms a passive balance mass. Supporting means 55 are resilient and may be, for example, springs. The suspension frequency of sub-frame 51 and supporting means 55 is designed to be such that it does not correspond to the resonant frequencies of the base frame BF. The suspension frequency in this example is 5 Hz, but may be any frequency which does not correspond to any of the dominant frequencies of the base frame BF. Depending on the design of the base frame BF the suspension frequency is typically in the range of 0.5 to 15 Hz.

When the substrate table WT is accelerated a reaction force is exerted on the base frame BF. However, any resulting vibrations above the suspension frequency (5 Hz) excite the sub-frame 51 (acting as a passive balance mass) instead of the base frame BF. The sub-frame 51 and supporting means 55 function as a dynamic filter so that frequencies above 5 Hz are not transmitted to the base frame BF. The resonant frequencies of the base frame are higher then 5 Hz and so are not excited. (Depending on the resonant frequencies of the base frame the suspension frequency may be higher, or lower, than 5 Hz.)

The spring system in this embodiment has low damping. It is possible that this could cause additional disturbance forces on the base frame BF. Additional damping can be included to prevent this. The damping is included in the support of the sub-frame 51 and could be a dash pot, other passive damping means, or some form of actively controlled damping. Active damping can be provided by a motor force actuator connected between the sub-frame 51 and the base frame BF. This motor force actuator is ideally a Lorentz motor, or other motor having no mechanical stiffness when not exerting a force.

Although supporting means 55 are depicted as supported sub-frame 51 in a direction perpendicular to the sub-frame 51 they could equally well be parallel to the sub-frame 51. Additional support for the sub-frame 51 could be added.

This system is simple to construct—there is no need to alter the positioning control system. The sub-frame 51, acting as a passive balance mass, is connected to the base frame, not a specific substrate table WT within the apparatus. In a multi-stage apparatus if more than one substrate table is moving, and hence more than one reaction force is exerted on the base frame, the sub-frame 51 will react to both these forces. There is therefore no need to provide additional balance masses for each moving table.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

Accordingly, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A lithographic apparatus, comprising:
a substrate holder configured to hold a substrate;
a radiation system configured to condition a beam of radiation;

a support structure configured to support a patterning device that imparts a desired pattern onto the beam of radiation;

a projection system that projects the patterned beam onto a target portion of the substrate;

a base frame;

at least one actuator that moves the substrate holder relative to the base frame; and a balance mass, supported by the base frame, arranged such that the substrate holder exerts a reaction force on the balance mass, wherein the balance mass is resiliently connected to the base frame with a suspension frequency that is different than resonant frequency of the base frame.

2. The lithographic apparatus of claim 1, wherein the balance mass comprises a sub-frame supported by the base frame and on which the substrate holder is placed.

3. The lithographic apparatus of claim 1, further comprising a resilient mechanism and/or a damper connected between the base frame and the balance mass.

4. A lithographic apparatus, comprising:

a substrate holder configured to hold a substrate;

a radiation system configured to condition a beam of radiation;

a support structure configured to support a patterning device that imparts a desired pattern onto the beam of radiation;

a projection system that projects the patterned beam onto a target portion of the substrate;

a base frame;

at least one actuator configured to apply a force to the base frame;

a balance mass supported by the base frame and coupled to the base frame via the at least one actuator; and a controller configured to control the at least one actuator, wherein when one or more moving components within the apparatus applies a reaction force to the base frame, the controller controls the actuator to apply a force, which is opposite in magnitude and direction to the reaction force, to the base frame.

5. The apparatus of claim 4, wherein the at least one actuator is connected between the base frame and a floor on which the base frame rests, and the controller controls the at least one actuator using feedforward control with an input of known movements within the lithographic apparatus, which exert a reaction force on the base frame.

6. The apparatus of claim 5, wherein the support structure comprises a mask holder that holds a mask, and wherein the known movements within the apparatus are movements of the substrate holder and/or the mask holder.

7. The apparatus of claim 4, wherein the at least one actuator comprises a piezo-electric actuator.

8. The apparatus of claim 4, wherein the support structure comprises:

a mask holder that holds a mask; and a mask frame that supports the mask holder for relative movement thereto, the mask frame being connected to the base frame by the actuator and supported for movement relative to the base frame, wherein the controller controls the actuator using feedforward control based on the known movements of the mask holder relative to the support structure.

9. The apparatus of claim 4, wherein the controller controls the at least one actuator using feedforward control with an input of known movements within the apparatus, which exert a reaction force on the base frame.

10. The apparatus of claim 4, wherein the controller has an input of known movements within the apparatus, which exert a reaction force on the base frame only in the main scanning direction of the base frame.

11. A device manufacturing method, comprising:

providing a substrate that is at least partially covered by a layer of radiation-sensitive material, the substrate being carried by a substrate holder that is movable, via at least one actuator relative to a base frame;

projecting a patterned beam of radiation onto a target portion of the substrate; and moving the substrate holder that exerts a reaction force to a balance mass that is supported by and coupled to the base frame;

wherein the balance mass is resiliently coupled to the base frame with a suspension frequency that is different than resonant frequency of the base frame.

* * * * *